United States Patent [19]

Gee et al.

[11] 4,218,693

[45] Aug. 19, 1980

[54] INTEGRATED LOGIC CIRCUIT HAVING INTERCONNECTIONS OF VARIOUS LENGTHS BETWEEN FIELD EFFECT TRANSISTORS OF ENHANCEMENT AND DEPLETION MODES

[75] Inventors: Lawrence F. Gee; Denis B. Jarvis, both of Chandlers Ford; Christopher J. Aldhous, Southampton, all of England

[73] Assignee: U.S. Philips Corporation, New York, N.Y.

[21] Appl. No.: 868,052

[22] Filed: Jan. 9, 1978

[30] Foreign Application Priority Data

Jan. 17, 1977 [GB] United Kingdom ............... 1788/77

[51] Int. Cl.$^2$ ................... H01L 27/02; H01L 29/78; H01L 27/10; H03K 3/353
[52] U.S. Cl. ................................. 357/41; 357/23; 357/45; 357/59; 357/91; 307/304
[58] Field of Search ................ 357/23, 41, 45; 307/304

[56] References Cited

U.S. PATENT DOCUMENTS

| | | | |
|---|---|---|---|
| 4,037,242 | 7/1977 | Gosney | 357/41 |
| 4,085,498 | 4/1978 | Rideout | 357/23 |
| 4,107,548 | 8/1978 | Sakaba et al. | 357/23 |
| 4,110,776 | 8/1978 | Rao et al. | 357/23 |
| 4,125,854 | 11/1978 | McKenny et al. | 357/41 |

OTHER PUBLICATIONS

Kawagoe et al "Minimum Size ROM Structure Compatible with Silicon-Gate E/D MOS LSI" IEEE J. Solid-State Circuits vol. SC-11 (6/76) pp. 360–364.

*Primary Examiner*—Gene M. Munson
*Attorney, Agent, or Firm*—Thomas A. Briody; Jack Oisher; Steven R. Biren

[57] ABSTRACT

An integrated logic circuit includes an array of insulated gate field effect transistors formed at the crossings of a plurality of substantially parallel first conductor tracks which form the transistor gate electrodes and a plurality of substantially parallel strip-shaped surface regions which form the source and drain electrode regions of the transistors. The field effect transistors of the device include a first group of transistors having a first threshold voltage and a second group of transistors having a second threshold voltage different from the first. In order to make a more compact, easily-designed and easily-manufactured circuit, the conductor tracks and the strip-shaped surface regions form a nonuniform array in which the track and surface regions need not all be of the same length. Further efficiencies are achieved by branching the strip-shaped surface regions where appropriate to implement the desired logic combination.

11 Claims, 7 Drawing Figures

INTEGRATED LOGIC CIRCUIT HAVING INTERCONNECTIONS OF VARIOUS LENGTHS BETWEEN FIELD EFFECT TRANSISTORS OF ENHANCEMENT AND DEPLETION MODES

This invention relates to integrated circuits for the generation of at least one logic combination of logic input signals to be applied and comprising a semiconductor body having a part mainly of one conductivity type, an array of insulated gate field effect transistors formed in said part and having gate electrodes self-registered with source and drain electrode regions, said transistors being formed at crossings of a plurality of substantially parallel first conductive tracks which comprise the transistor gate electrodes and a plurality of substantially parallel strip-shaped surface regions of the opposite conductivity type which adjoin a surface of the body, said surface regions comprising the source and drain electrode regions of said transistors, a first group of the transistors being transistors of a first form having a first threshold voltage and a second group of the transistors being transistors of a second form having a second threshold voltage, and in which said logic input signals are to be applied to the gate electrodes of the transistors of one of said two groups, said logic combination to be generated being predetermined with the aid of the crossings and the form of transistors present at such crossings and with the aid of the interconnections of transistors of said one group via the opposite conductivity type strip-shaped surface regions.

The provision of read-only memories and logic circuits in the form of arrays of insulated gate field effect transistor structures is already established in the integrated circuit art. Historically this commenced with the use of aluminum gate non-self-aligned insulated gate field effect transistor technology. In this manner it was found possible to construct a read-only memory, or reproduce a simple logic function, in the form of a matrix of aluminum gate lines crossing at right angles to diffused source and drain lines. In the memory application the state of each memory cell was predetermined by the presence or absence of an active transistor structure below the portion of an aluminum gate line situated between adjoining source and drain lines, said presence or absence being determined by a respectively thin or thick oxide layer portion below said portion of the aluminum gate line. These devices were basically reproducing OR functions. With the subsequent introduction of silicon gate technology with its inherent advantages there was devised a further read-only memory array in the form of a matrix. However in such a device the matrix is somewhat more complex and each memory cell occupies a relatively large area due to the fact that the self-registered process does not normally permit a polysilicon line to pass directly over a diffusion line without an interruption in the diffusion line. In this read-only memory the state of each memory cell is determined by the presence or absence of an active transistor having a polysilicon gate electrode situated on a thin oxide layer portion and self-registered with diffused source and drain electrode regions. In the matrix each polysilicon line is used for connecting the transistor gate electrodes formed in said line in parallel with the respective address line. The source electrodes of the transistors of each such line are connected in parallel via the diffusion and the drain electrodes of said transistors have to be individually contacted. This contacting is effected by aluminum lines in the matrix which extend at right angles to the polysilicon lines and are insulated therefrom at the crossings, the contacting of the drain electrodes by the aluminum being through apertures in the insulating layer. This memory again basically reproduces OR functions.

In "I.E.E.E. Journal of Solid State Circuits", Vol. SC-11, No. 3, June 1976, pages 360–364, there is described an improved read-only memory based on silicon gate technology. In this device there is a matrix formed by a plurality of polysilicon lines which cross a plurality of diffusion lines with a transistor structure being formed at each crossing.

In this Specification the term "crossing" is to be interpreted in the broad sense that in the lay-out of the circuit an upper line, that is a polysilicon line in the said improved read-only memory, has the appearance of overlying the lower line, that is a diffusion line, at the area of the crossing, whereas in practice there will normally exist a discontinuity in the lower line at the area of the crossing, for example a discontinuity due to an absence of the doping impurity forming the lower line or a discontinuity formed by a difference in doping level at the area of the crossing, said discontinuity being present as a result of the processing involved in forming self-registered gate transistors.

In said improved read-only memory a first group of the transistors are enhancement mode transistors and a second group of the transistors are depletion mode transistors, the difference being determined by the existence of an ion implanted channel. In this manner the condition of a memory cell is determined by the presence of an enhancement mode transistor or a depletion mode transistor. The memory circuit consists of enhancement mode and depletion mode transistors arranged in lines with the polysilicon lines constituting addressing lines, the enhancement transistors in each line being connected in series as driver elements via the diffusion line and the depletion mode transistors which effectively act as series resistors between the enhancement mode transistors. In this manner a relatively compact read-only memory can be formed with a small area for each memory cell, particularly as the series arrangement of the transistors does not necessitate the further contacting of individual transistors as in the earlier proposed silicon gate read-only memories in which a parallel arrangement of transistors is present and an aluminum interconnect pattern is present. The said read-only memory using enhancement mode and depletion mode transistors is basically the reproduction of a plurality of AND gates. In said article in "I.E.E.E, Journal of Solid State Circuits" it is further recorded that the read-only memory concept using enhancement and depletion mode transistors for driver elements can be applied to programmable logic arrays and four-phase ratioless dynamic circuits. However when using the matrix structure to produce relatively complex logic circuits, it becomes necessary to have a relatively deep matrix and in which in order to produce combinatorial logic, that is any desired combination of both AND and OR functions, there exists an undue multiplication of some transistor structures. In particular, in this manner an OR gate has to be formed by a line in which all but one transistors are depletion transistors and to combine such OR gates with AND gates results in very large and deep matrices.

According to the invention there is provided an integrated circuit for the generation of at least one logic combination of logic input signals to be applied and comprising a semiconductor body having a part mainly of one conductivity type, an array of insulated gate field effect transistors formed in said part and having gate electrodes self-registered with source and drain electrode regions, said transistors being formed at crossings of a plurality of substantially parallel first conductive tracks which comprise the transistor gate electrodes and a plurality of substantially parallel strip-shaped surface regions of the opposite conductivity type which adjoin a surface of the body, said surface regions comprising the source and drain electrode regions of said transistors, a first group of the transistors being transistors of a first form having a first threshold voltage and a second group of the transistors being transistors of a second form having a second threshold voltage, and in which said logic input signals are to be applied to the gate electrodes of the transistors of one of said two groups, said logic combination to be generated being predetermined with the aid of the crossings and the form of transistor present at such crossings and with the aid of the interconnections of transistors of said one group via the opposite conductivity type strip-shaped surface regions, characterized in that the array is an irregular array, said logic combination additionally being predetermined with the aid of further interconnections formed with the array, and said further interconnections comprising at least a branching of the strip-shaped regions.

In a preferred form of the integrated circuit said plurality of first conductive tracks extends as a group of lines at least partly on insulating material on said body surface and substantially parallel to a first direction and said plurality of substantially parallel strip-shaped surface regions of the opposite conductivity type extends as a group of lines substantially parallel to a second direction which is substantially at right angles to the first direction, and said strip-shaped surface regions of the opposite conductivity type having discontinuities at the areas of the crossings, said first and second threshold voltages being determined such that the transistors of the second group are conducting under both logic states and the transistors of the first groups are conducting only under one logic state, and in which said logic signals are to be applied to the gate electrodes of the transistors of the first group, said logic combination to be generated being determined by the interconnection pattern of the first group of transistors, said interconnection pattern comprising the series connection of the main current path of each first group transistor in a common line extending in said second direction and provided by the strip-shaped surface region associated with said line and the main current path of the or each second group transistor in said line. According to the invention this integrated circuit is characterized in that said interconnection pattern further comprises the series and/or parallel connection of the main current paths of one or more first group transistors in different lines extending in said second direction, the lines in at least one of said two groups of lines being of a plurality of different lengths and said further interconnections comprising further opposite conductivity type strip-shaped surface regions extending in a direction substantially parallel to the first direction. See, for example, FIG. 2, for a simplified illustration.

An integrated circuit in accordance with the invention is based upon the provision of lines of serially connected transistors having first and second threshold voltages, for example enhancement and depletion mode transistors, not necessarily in a rigidly defined matrix arrangement as in the described prior art read-only memory but in an irregular form of array in which within earlier or both a group of lines of opposite conductivity type strip-shaped surface regions and a group of lines of conductive tracks which comprise the transistor gate electrodes, a plurality of the lines are of different lengths, together with the provision at least partly within the array of a branching of parts of the interconnection pattern. An example of such branching is shown in FIG. 2 ($SD_1$ and $SD_2$). In this manner it is possible to build up relative complex logic circuits without the necessity to form deep matrices. In particular by the provision of said further opposite conductivity type strip-shaped surface regions it is readily possible to achieve a combinatorial logic function comprising both AND and OR functions within the array without the necessity of multiplication of transistor structures which occurs when using a true matrix structure. This may be referred to as a "branching" of the logic within the array as opposed to laying out a true, regular matrix form of array.

In accordance with a further feature of an integrated circuit in accordance with the second aspect of the invention the interconnection pattern additionally comprises the provision within the array of further, separately provided conductive tracks which extend on insulating material and are separated from the first provided conductive tracks by insulating material where overlying said first conductive tracks, the further conductive tracks forming conductive connections via apertures in the insulating material to first provided conductive tracks and/or to opposite conductivity type surface regions, as shown for example, in FIG. 7. In this manner a further interconnection layer, for example of aluminum, is used to yield a better packing density. Furthermore the use of such an aluminum interconnect level enables a considerably greater degree of freedom in the lay-out of the circuit. Effectively with a, for example, synchronous or static logic system arranged as clocked flip-flops with combinatorial logic between the flip-flops, it is possible in this way using the aluminum to distribute the various parts of the logic circuit among the interconnections and thereby reduce the total length of the interconnections. This may be referred to as "interlace logic".

A further advantage of an integrated circuit structure in accordance with the invention resides in the inherent facility to use computer aided design for implementation of a circuit mask for production of the logic circuit, as illustrated in FIGS. 3–7. This is facilitated due to the possibility of locating the said lines of opposite conductivity type surface regions and the said lines of conductive tracks comprising the gate electrodes according to lines of a grid with transistors defined at the crossings being located at grid points and not disturbing the interconnections according to the grid lines. As a further feature in such a circuit the further opposite conductivity type surface regions where present within the array may be arranged substantially along parts of grid lines where there are no first conductive tracks. Furthermore the computer aided design may be readily arranged so that in the conversion of an equivalent stick diagram of the logic circuit into a circuit mask pattern only those transistors of one group, for example only the enhancement transistors in the case of use of enhancement and depletion transistors, need be specified, the computer aided design facility automatically providing the desired masking configuration at all the crossings which are not thereby specified. Furthermore in such a lay-out of the said synchronous or static logic systems the flip-flops can be specified as outline boxes with connections located on grid points at the periphery of the array.

In one form of an integrated circuit in accordance with the second aspect of the invention the lines of conductive tracks extending in said first direction are of a plurality of different lengths and the lines of strip-shaped regions extending in said second direction are of a plurality of different lengths, as shown, for example, in FIG. 2. In this manner a relatively compact array can be formed in order to reproduce a desired combinatorial logic function. However within the scope of the invention is the case where, for example, all the lines of conductive tracks extending in said first direction are of the same length and the strip-shaped regions which branch within the array are of a plurality of different lengths.

A single conductive track may be present in more than one of said lines extending in said first direction. Thus, for example a conductive track may itself be branched or may be diverted from one line to another line. This generally enables an increase in the packing density to be achieved.

Reference herein to the conductive tracks and strip-shaped surface regions extending as lines in certain directions is to be understood to mean that for the major part the tracks and regions extend in said directions and does not preclude the tracks or regions having end parts which are oriented, for example at right angles, to said directions. Thus although the majority of transistor channel regions between source and drain electrode regions will be orientated in a direction parallel to the said second direction in which the strip-shaped surface regions extend there may additionally be present some transistors in which the channel regions are oriented, for example at right angles, to said second direction. This again may be used to achieve a greater packing density.

Embodiments of the invention will now be described, by way of example, with reference to the accompanying diagrammatic drawings, in which.

Figure 1:
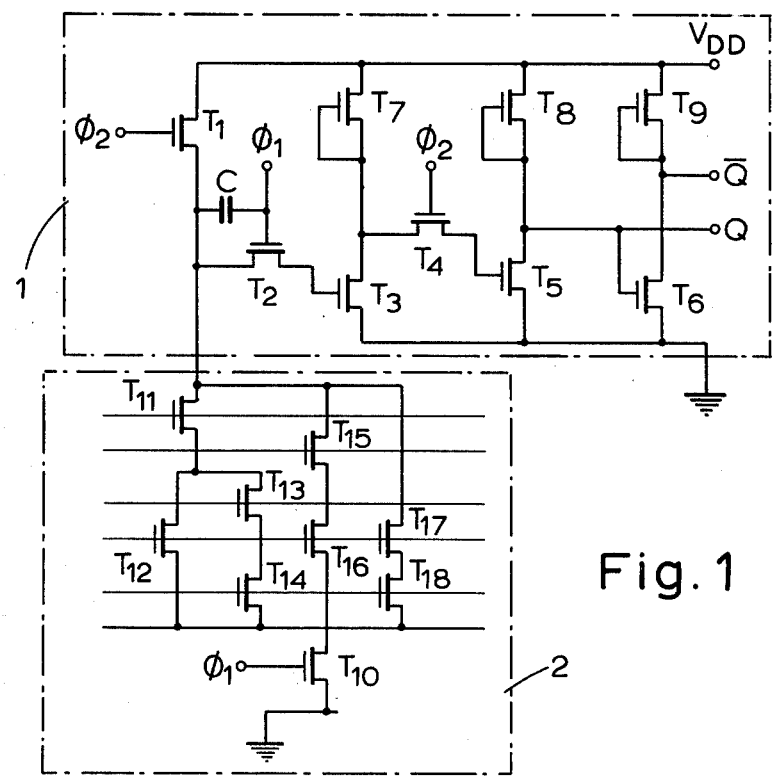
FIG. 1 shows the circuit diagram of part of a synchronous logic system, said part comprising a flip-flop and a combinatorial logic circuit.

Referring now to FIG. 1 the circuit diagram shows part of a synchronous logic system which is arranged as two-phase clocked flip-flops having combinatorial logic between them, the part shown consisting of a single flip-flop, indicated within the boundary line 1, comprising both enhancement and depletion mode insulated gate field effect transistors and the associated logic circuit, indicated within the boundary line 2, comprising an array of enhancement mode insulated gate field effect transistors. The operation of the circuit when embodied in n-channel technology with $V_{DD}$ positive is such that when the $\phi_2$ clock input is taken to a high level the logic array is precharged via the connection of transistor $T_1$ which is ON during this phase, the transistor $T_2$ being OFF as is the transistor $T_{10}$ connected to ground at the bottom of the array. During this phase transistor $T_4$ is also transferring information from the drain of transistor $T_3$ onto the output transistor $T_5$ thus causing the outputs Q and $\overline{Q}$ to change during this period. When subseqeuntly the clock input $\phi_1$ is taken high then transistor $T_1$ is OFF and transistor $T_2$ is ON as also is the transistor $T_{10}$ connected to ground at the bottom of the array. The array is sensed with the input therefrom being high or low depending on whether there is or is not a conductive path to ground through the array, this in turn depending upon the logical input signals to the gates of the enhancement transistors present in the array. As $T_2$ is ON this information is transferred to the gate of $T_3$ and thus directly to the drain of $T_3$ in inverted form. The capacitor C is provided in order to compensate for possible degradation of the logic level at the input to the flip-flop due to an imbalance of capacitance between that of the array and the gate capacitance of transistor $T_3$. In the flip-flop 1 the transistors $T_7$, $T_8$ and $T_9$ are depletion transistors.

The logic array shown in FIG. 1 effectively constitutes a three-input OR gate of which the first input is formed by transistors $T_{11}$, $T_{12}$, $T_{13}$, $T_{14}$, the second input is formed by transistors $T_{15}$ and $T_{16}$ and the third input is formed by transistors $T_{17}$ and $T_{18}$. The first input itself comprises an OR gate formed by the parallel connected main current path of transistor $T_{12}$, and main current paths of transistors $T_{13}$ and $T_{14}$, and the series connected main current paths of transistor $T_{13}$ and $T_{14}$ themselves constitute an AND gate. The second input itself comprises an AND gate formed by the series connected main current paths of transistors $T_{15}$ and $T_{16}$. The third input itself comprises an AND gate formed by the series connected main current paths of transistors $T_{17}$ and $T_{18}$. The logical input signals to the gates of the transistors $T_{11}$ to $T_{18}$ are supplied by the outputs Q and $\overline{Q}$ of other circuits, for example, flip-flops, Schmitt triggers, or static logic gates.

Figure 2:
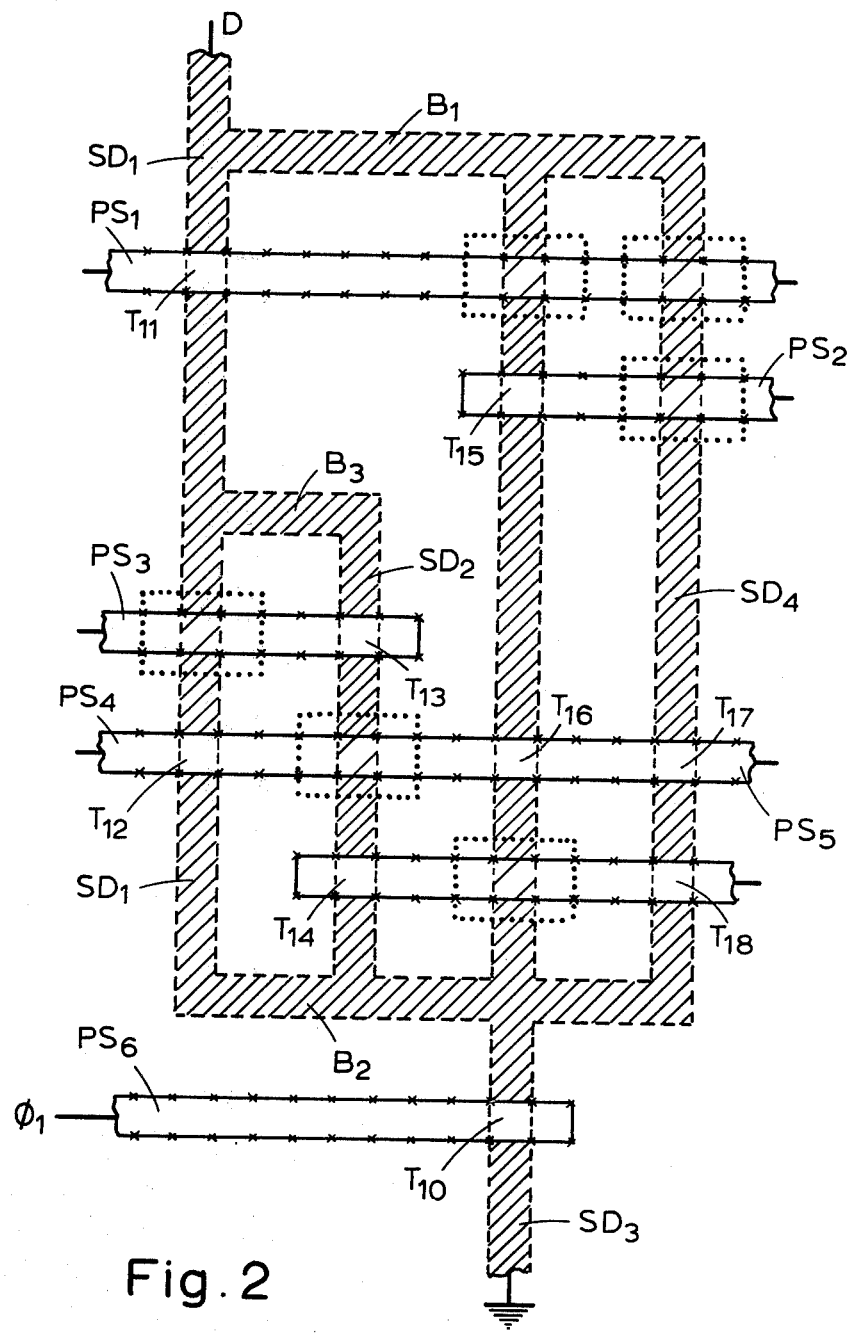
FIG. 2 shows in plan view the lay-out of part of an integrated circuit in accordance with the invention, said part consisting of the logic circuit part shown in FIG. 1.

FIG. 2 shows a plan view of the lay-out of the part 2 of the circuit shown in FIG. 1 in an integrated circuit in accordance with the invention and in which the semiconductor body is of silicon. In this circuit the transistors have polycrystalline silicon gate electrodes which are self-registered with the transistor source and drain regions. In the present embodiment the transistors are n-channel transistors present in a silicon body part mainly of p-type conductivity, the transistor source and drain regions being formed by n-type diffused surface regions. In the part of the circuit shown in FIG. 2 the transistors $T_{10}-T_{18}$ are present in an irregular array and formed as enhancement mode transistors, said array additionally comprising depletion mode transistors. The transistor structures, that is both enhancement and depletion mode transistors, are defined at the crossings between a plurality of conductive tracks $PS_1-PS_6$ of polycrystalline silicon which extend as lines of various different lengths at least partly on a silicon oxide layer on the silicon body surface and a plurality of strip-shaped n-type surface regions $SD_1$–$SD_4$ which extend as lines of various different lengths in a direction substantially at right angles to the polysilicon tracks. The polysilicon tracks at the area of the crossings are present on a relatively thin portion of the silicon oxide layer and there comprise the transistor gate electrodes. The strip-shaped n-type surface regions $SD_1$–$SD_4$ comprise the transistor source and drain electrode regions and have discontinuities at the crossings, said discontinuities comprising the transistor channel regions which are being formed as a result of the self-aligned silicon gate processing used in the manufacture of the integrated circuit. It is mentioned that the term crossing should be construed accordingly and as previously referred to. Where the discontinuities are such that below the polysilicon the silicon surface region is p-type the transistors are enhancement transistors and in this manner the transistors $T_{10}$–$T_{18}$ are formed, the reference letters and numerals being present in FIG. 2 at the areas of the channel regions. Where the discontinuities are such that below the polysilicon the silicon surface region is n-type the transistors are depletion transistors. In the present embodiment the depletion transistors are formed at certain crossings due to the local provision of ion implanted n-type surface regions prior to the deposition of the polysilicon layer in which the tracks $PS_1$–$PS_4$ have been defined. The areas over which a photoresist masking layer has been removed in the processing prior to bombardment of the surface with donor ions are within the boundaries indicated by the continuous lines of dots. The donor implantation is effectively confined to the line of the strip-shaped aperture present within each such area and formed in a relatively thick part of the silicon oxide layer.

In the present example the depletion transistors effectively serve as low resistance connections in the lines $SD_1$–$SD_4$. It is thus evident that to locate enhancement transistors at certain crossings is relatively simple and pre-determined by the masking used for defining the areas at which donor ions are to be implanted. In the drawing the strip-shaped regions $SD_1$–$SD_4$ are shown with shading lines and such lines indicate the presence of n-type surface regions. At the positions of the enhancement transistors the shading lines are absent below the polysilicon gate electrodes due to the absence of any introduced donor impurities, either during the donor ion implantation or when effecting the diffusion to form the strip-shaped regions. The shading lines are present with lower density below the gate electrodes of the depletion transistors in order to represent the implanted, lower donor concentration at these areas. The boundaries of the strip-shaped regions coincide substantially with the boundaries of the areas at which the thicker silicon oxide has been etched prior to forming the thinner gate oxide, said boundaries being indicated by broken lines.

It should be noted that due to the provision of the polysilicon tracks $PS_1$–$PS_6$ as lines of various different lengths and the strip-shaped diffused surface regions $SD_1$–$SD_4$ as lines of various different lengths, with some of the tracks terminating within the array of transistors, the array of transistors does not constitute a regular array as would be formed if the diffused surface regions and the polysilicon lines formed a matrix of crossing lines respectively of equal lengths. This feature is used to full advantage to achieve a form of combinatorial logic in a simple but advantageous manner. In the first instance considering the transistor $T_{11}$ and its two routes of connection to ground each via the transistor $T_{10}$, if the array had been laid out in the form of a regular matrix then the transistor $T_{11}$ would have to be produced in two different lines and also a larger number of redundant crossings where depletion transistors have to be formed would exist. However due to the provision of the array in the irregular form and due to the provision of further strip-shaped diffused n-type surface regions $B_1$, $B_2$ and $B_3$ which extend in a direction substantially at right angles to the strip-shaped regions $SD_1$–$SD_4$ the combinatorial logic function is more conveniently reproduced without undue duplication of transistor structures. In particular, by the presence of the strips $B_2$ and $B_3$, there is provided a branching of the logic tree, within the interconnections of the enhancement transistors $T_{10}$–$T_{14}$. Thus the series-connected enhancement transistors $T_{13}$ and $T_{14}$ are connected in parallel with the enhancement transistor $T_{12}$. In this embodiment, of the further strip-shaped n-type "branching" regions, $B_1$, $B_2$ and $B_3$, those within the array are $B_2$ and $B_3$, the region $B_1$ being outside the array. In other more complex logic circuits there may be a considerable number of such "branching" regions within the array.

It will be understood that the present embodiment is chosen to illustrate the underlying principles of the invention and therefore due to the relative simplicity of the logic circuit, in terms of advantage, the savings would not at first appear to be substantial. This is because in this embodiment there is only one OR gate within the interior of the array. The savings become much more evident when further OR gates are added, particularly when present at opposite ends of the array.

In the present embodiment the logic input signals are applied via the polysilicon lines $PS_1$, $PS_2$, $PS_3$, $PS_4$ and $PS_5$ the line $PS_6$ being connected to the clock input $\phi_1$.

The provision of the array in a non-regular form together with (a) the branching feature of using the further strip-shaped regions, such as $B_1$, $B_2$ and $B_3$, to form the desired combinatorial form of logic input signals and (b) the ability to form the desired transistor structures and their interconnection without recourse to a further level of interconnection tracks can be further used to even greater advantage when more complex logic functions have to be reproduced. This is achieved by using a further level of interconnection tracks in order to give a greater freedom in the arrangement of the various parts of the logic circuit with the result, for example, that the physical lay-out of a complex static or synchronous logic circuit follows the conceptual lay-out. One embodiment in which the integrated circuit includes a synchronous logic circuit will now be described with reference to FIGS. 3 to 7.

Figure 3:
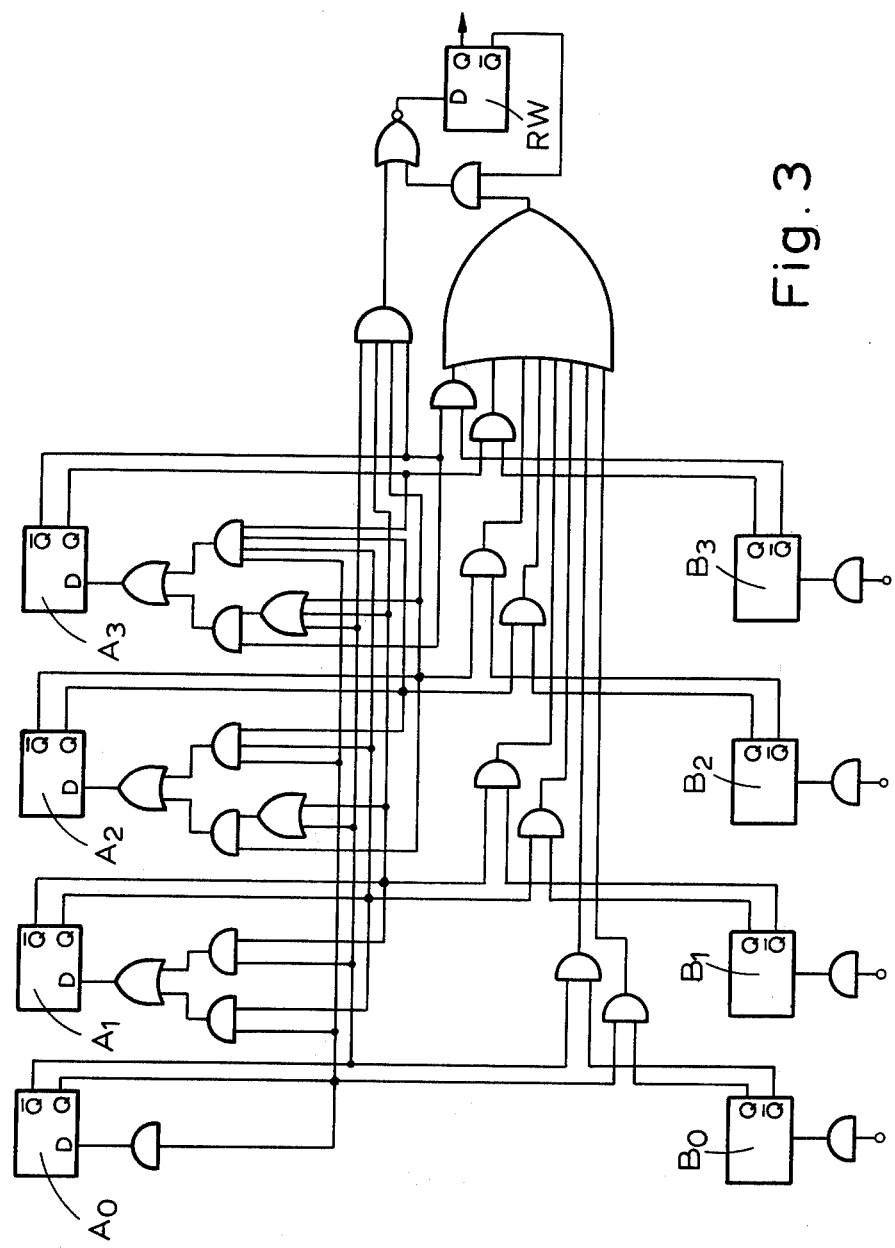
FIG. 3 shows the logic circuit diagram of a further synchronous logic system and consists of a form of digital to analog converter in which a control circuit produces a variable mark-space ratio at a given frequency.

FIG. 3 shows a typical example of a control circuit which produces a rectangular waveform signal of variable mark-space ratio, the value of which is controlled by the digital input data and comprises an arrangement of edge triggered dynamic flip-flops and combinatorial logic gates. The normal application of the circuit is to feed the output Q from flip-flop RW into a circuit comprising the series connection of a resistor and capacitor provided outside the integrated circuit. The voltage on the capacitor will vary with the mark-space ratio and effectively the circuit may be considered as a form of digital to analog converter.

The flip-flops $B_0$, $B_1$, $B_2$, $B_3$ constitute stores which are fed with input signals from another integrated circuit or from another part of the same integrated circuit, for example a data processing circuit part with binary output. The edge-triggered flip-flops $A_0$, $A_1$, $A_2$, $A_3$ together with the part of the combinatorial logic connected to the D-inputs thereof and fed from the Q and $\overline{Q}$ outputs thereof constitute a 4-stage binary synchronous counter. The flip-flop RW has a further part of the combinatorial logic circuit connected to the D-input thereof which constitutes a comparator which sets the flip-flop RW which is reset on a count of zero.

From FIG. 3 it is clear that the combinatorial logic arranged between the flip-flops is composed of both AND and OR gates. The logic combination or combinations to be generated comprises or comprise at least one additive or AND subcombination or at least one alternative or OR subcombination, which subcombination in turn forms part of an alternative or OR relation or an additive or AND relation respectively.

Figure 4:
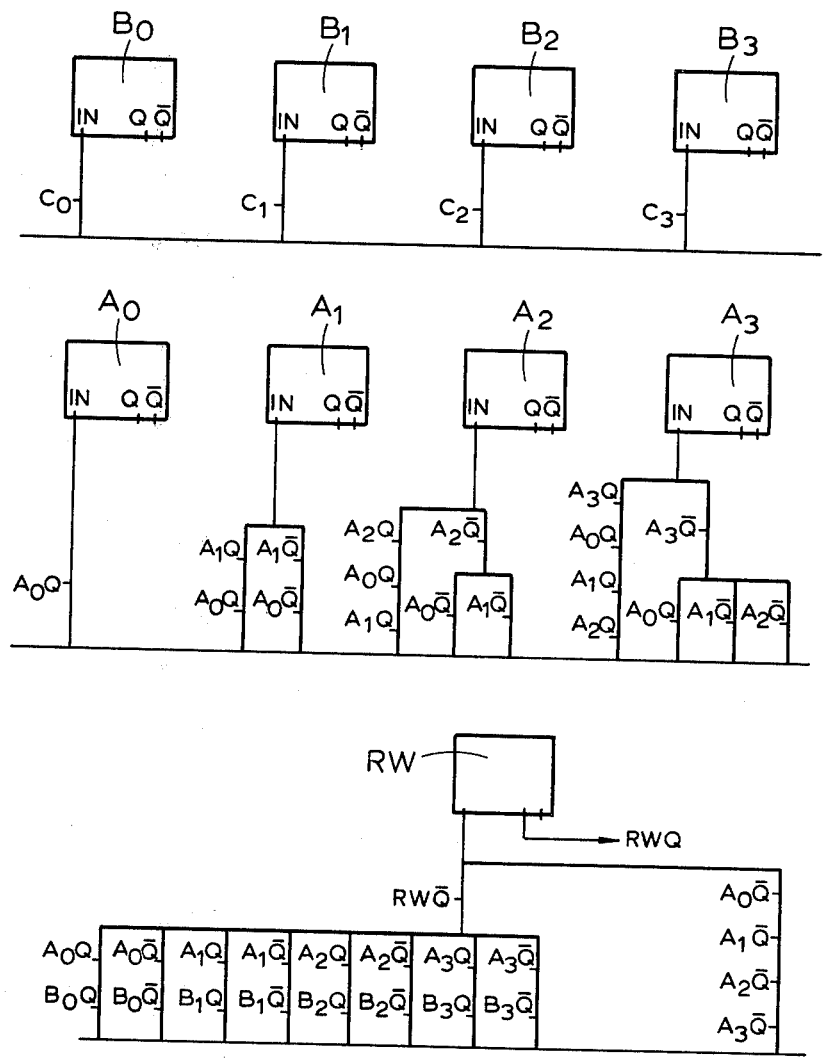
FIG. 4 shows the conceptual version of the circuit shown in FIG. 3 and in a form suitable for comptuer aided design lay-out and checking of masking patterns.

FIG. 4 shows the conceptual version of the circuit shown in FIG. 3 arranged in three blocks and to be embodied using insulated gate field effect transistors. In the upper block flip-flops $B_0$, $B_1$, $B_2$ and $B_3$ are present, the input gates $C_0$, $C_1$, $C_2$, $C_3$ being present on another integrated circuit in this embodiment. In the center block the flip-flops $A_0$, $A_1$, $A_2$, $A_3$ are present with the logic tree connected to the D-inputs being shown. Thus as an example consider the logic tree connected to the D-input of $A_1$. This consists of a two-input OR gate of which one input is an AND gate having the logic input signals $A_1Q$ and $A_0Q$ and the other input is an AND gate having the logic input signals $A_1\overline{Q}$ and $A_0\overline{Q}$. Similarly in the lower block comprising the flip-flop RW the logic tree is laid out in terms of OR gates where a branching is present and AND gates of which the logic input signals are identified and constituted by outputs of the flip-flops.

Clearly it would be possible to lay out the circuit in the form of flip-flops $B_0$, $B_1$, $B_2$, $B_3$ arranged side by side in one row, $A_0$, $A_1$, $A_2$, $A_3$ arranged side by side in another row with the logic tree depending from these flip-flops present in a matrix form of array, and a further array for the logic tree depending from the flip-flop RW. In having such separate arrays this would necessitate one of $8 \times 10$ lines below flip-flops $A_0$–$A_3$ and another of $9 \times 17$ lines below flip-flop RW with an unduly complex interconnection pattern arranged outside the arrays.

Alternatively it would be possible to arrange the flip-flops in a line and provide the logic circuit in a single array in the form of a regular matrix. This would involve, using silicon gate technology with enhancement and depletion transistors, a relatively deep array having 17 lines of polysilicon and 41 lines of diffusion. This would involve the use of a relatively large area of the available silicon surface and would, due to the necessity to allow for the interconnection pattern, occupy a greater width than the line of flip-flops. However by using a structure in accordance with the present invention and in which a further level of interconnection tracks is present a relatively simple lay-out is achieved with considerable savings in the area of the silicon surface occupied. This saving in the present example will be at least 30% and in some other examples up to 50% compared with the lay-out in the form of a regular array as a matrix. Effectively the combinatorial logic is interwoven or "interlaced" within the interconnection of all the flip-flops which are arranged in a single row. Furthermore when using such a structure for the array there exists a considerable flexibility in the possibilities for layout of other circuit parts when the array forms part of a very large scale integrated circuit.

Figure 5:
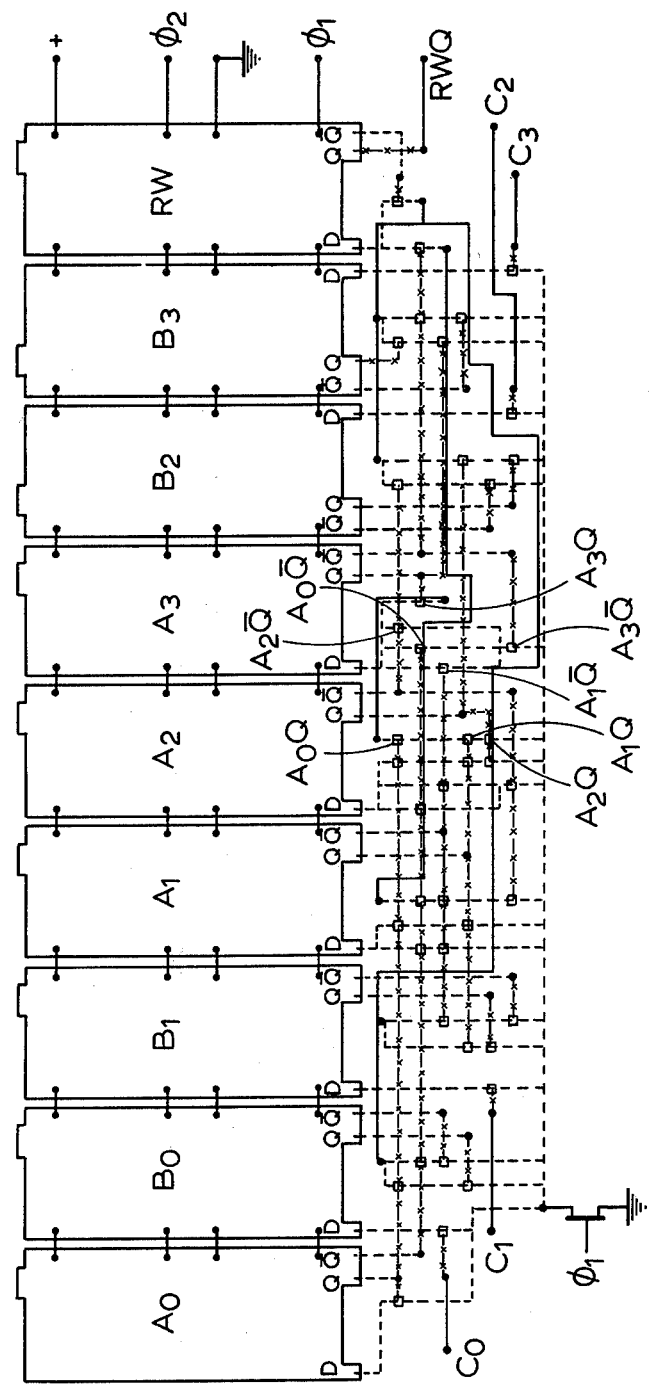
FIG. 5 is a diagrammatic representation of the masking lay-out of the circuit shown in FIGS. 3 and 4 in the form of an integrated circuit in accordance with the invention.

FIG. 5 shows a diagrammatic outline of the lay-out, sometimes called a stick diagram, of the circuit shown in FIGS. 3 and 4 when formed as part of an integrated circuit in accordance with the invention, the semiconductor body being of silicon and the transistors being n-channel transistors in the embodiment. A stick diagram is a diagram in which conductive tracks or semiconductor regions of finite width are represented simply by a line. Within the upper substantially rectangular boxes defined by sold lines the flip-flops $A_0$–$A_3$, $B_0$–$B_3$ and RW are shown. The circuitry of the flip-flops closely follows that shown in FIG. 1 and the lay-out will not be described as it forms no essential part in the description of the integrated circuit in accordance with the invention. The connections between the sides of adjoining boxes are intended to represent the fact that positive and negative (in this case connected to ground) supply lines together with the clock input lines $\phi_1$ and $\phi_2$ extend as continuous aluminum lines across the complete row of flip-flops and each form connections to parts of the individual flip-flops via apertures in the insulating layer on the semiconductor body surface. At the lower part of each box representing the area of a flip-flop there are shown three connections which for $A_0$, $B_0$, $B_1$, $A_1$, $A_2$, $A_3$, RW in order going from left to right constitute the D-input of the flip-flop, the normal output Q of the flip-flop and the inverted input $\overline{Q}$ of the flip-flop, and for $B_2$ and $B_3$ in order going from left to right constitute the inverted output $\overline{Q}$, the normal output Q and the D-input.

Situated adjacent the row of nine flip-flops is an irregular array of transistors of a structural form which corresponds to that shown in FIG. 2 with the additional feature that a further level of interconnection is employed and is provided by conductive tracks of aluminum extending across the array. In the Figure within the area of the array broken lines represent diffused n-type strip-shaped surface regions which regions comprise the transistor source and drain regions, the lines formed by alternatively situated dashes and crosses represent conductive tracks of polycrystalline silicon which tracks comprise the transistor gate electrodes, and the solid lines represent tracks of aluminum which form interconnections. Some of the crossings of the polysilicon tracks with the diffused strip-shaped regions are identified with squares. It is at these crossings where the enhancement transistors are formed, the discontinuities in the strip-shaped surface regions being such that the silicon body material is p-type below the polysilicon gate electrodes at these crossings. At the remainder of the crossings, which are not separately identified, the transistors are depletion transistors and the silicon body surface at these crossings comprises locally implanted donor concentrations, the discontinuities in the strip-shaped regions at these areas consisting of a change in impurity doping.

The solid black dots within and at the boundaries of the array represent a connection between different levels. These include connections of polysilicon tracks to diffusion lines, connections of aluminum tracks to polysilicon tracks and connections of aluminum tracks to diffusion lines. In this array, as in the array in FIG. 2, the lines of diffused strip-shaped regions and the lines of polysilicon tracks both are of various different lengths and some of the diffused strip-shaped regions are joined by further diffused strip-shaped regions extending substantially parallel to the polysilicon lines. In this manner the logic tree is effectively branched, some of said further diffused strip-shaped regions extending within the array.

As an example, the branching of the logic tree in this manner and the use of an aluminum track interconnection is specifically identified for the portion of the logic connected to the D-input of the flip-flop $A_3$. It is seen that four diffused strip-shaped lines are branched from the D-input. In the first line the main current path of the transistor having gate input $A_1\overline{Q}$ is present, the three remaining transistors formed in the crossings of this line being formed as depletion transistors having their main current paths connected in series and in series with that of transistor $A$, $\overline{Q}$. In the second line the main current paths of the transistors having gate inputs $A_0\overline{Q}$ and $A_3\overline{Q}$ are present, the two other transistors formed in the crossings of this line being formed as depletion transistors having their main current paths connected in series with those of transistors $A_0\overline{Q}$ and $A_3\overline{Q}$. In the third line the transistor having gate input $A_2\overline{Q}$ is present, the other transistor formed in the other crossing of this line being formed as a depletion transistor. In the fourth line there are two crossings, one consisting of the transistor having the gate input $A_3Q$ and the other being formed as a depletion transistor. At the end of said fourth line there is a connection to the diffused strip-shaped region formed by an aluminum track. This track at its other end forms connection to the end of another diffused strip-shaped region in which is present the series connection of transistors having gate inputs $A_0Q$, $A_1Q$ and $A_2Q$. In this way the AND gate structure having inputs $A_0Q$, $A_1Q$, $A_2Q$ and $A_3Q$ is located in part in the portion of the logic situated below the flip-flop $A_2$. The other parts of the portion of the logic connected to the D-input of $A_3$, in particular the OR gates are enabled by the described branching using further strip-shaped regions extending substantially parallel to the polysilicon tracks.

In this embodiment the polysilicon tracks extending substantially parallel to one direction and the diffused strip-shaped regions extending substantially parallel to another direction at right angles to said one direction are present at least in part on lines of an imaginary grid, the transistors in the array being formed at some of the grid points, the further diffused strip-shaped regions extending parallel to the polysilicon lines where present within the array also extending along grid lines. It is also shown in this embodiment that the polysilicon tracks can be diverted from one line to another. Thus below $A_3$ in said third branched line the transistor identified as having gate input $A_2\overline{Q}$ has its gate electrode formed by a polysilicon track which at the first crossing below $A_2$ contacts the diffusion line and then is diverted to a lower line. Such a diversion of a polysilicon line is also present below the flip-flop $A_3$.

From FIG. 5 it is seen that the employment of the structure in accordance with the invention provides a relatively shallow array in which the combinatorial logic parts of the circuit are interlaced with the interconnections of the flip-flops.

Figure 6:
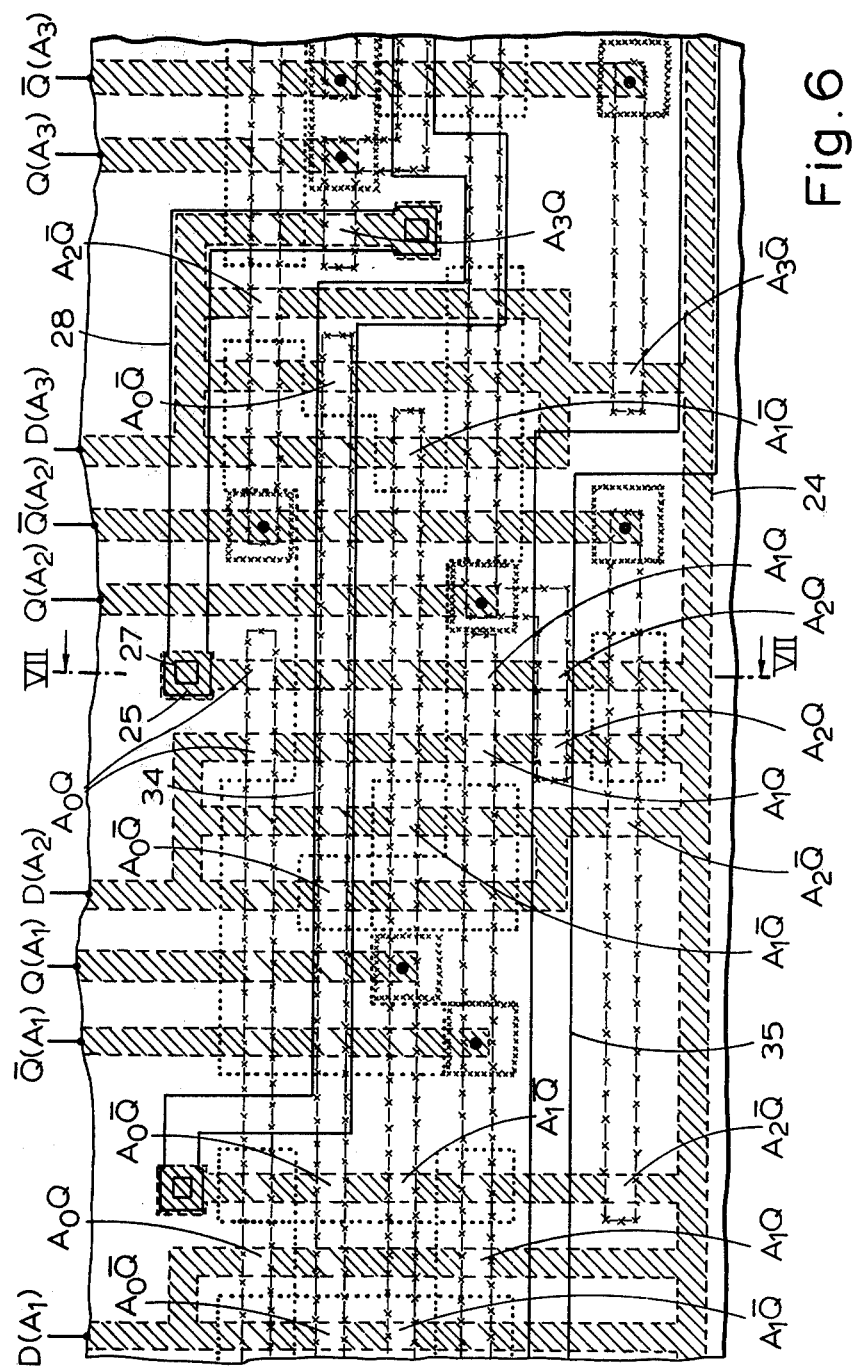
FIG. 6 is a plan view of part of the integrated circuit when formed using the masking lay-out shown in FIG. 5.

FIG. 6 shows a plan view of the semiconductor body and applied layers of a portion of an integrated circuit which includes a circuit part having the lay-out as described with reference to FIG. 5. In this Figure the portion present is the part of the array below the flip-flops $A_1$, $A_2$ and $A_3$. The notation used for showing the various layers and regions is exactly the same as that used in FIG. 2, with the additional features that aluminum tracks are represented by solid lines with no intermediate shading, connections of aluminum to diffused surface regions are formed by squares in solid line located within the aluminum lines, and with respect to connections of polysilicon tracks to diffused surface regions the boundaries of the areas over which in the processing a masking has been removed in order that the thin oxide layer can be selectively removed prior to depositing the polysilicon layer, in which layer the tracks are subsequently defined, are indicated by continuous lines of crosses. To further clarify these contacts of polysilicon to diffused regions, where the diffused impurity has passed through the polysilicon in contact with the silicon surface, large black dots are present on the centres of such connections.

For the purpose of identification the enhancement transistors are all separately identified with respect to the gate input signals supplied via the polysilicon lines and the connections thereto from the outputs of the flip-flops.

Figure 7:
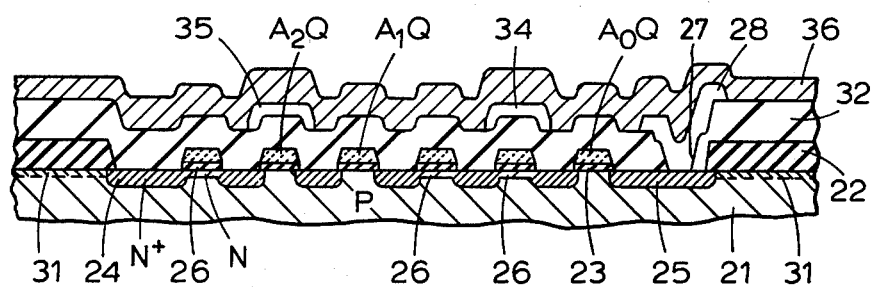
FIG. 7 is a cross-sectional view of a portion of the integrated circuit part shown in FIG. 6.

FIG. 7 shows a cross-section through part of the semiconductor body of the integrated circuit and taken along the line VII—VII of FIG. 6. The p-type semiconductor body part 21 of silicon is shown having on its surface a relatively thick silicon oxide layer part 22 and a relatively thin silicon oxide layer part 23. The various dimensions of the various regions will not be specified herein as they form no essential part of the inventive concept and in any particular case can be readily determined by those skilled in the art. The strip-shaped $n^+$-type diffused region lies in the section within the aperture in the thick oxide layer 22, one end being indicated by reference numeral 24 and the other end by reference numeral 25. The $n^+$-strip-shaped region 24, 25 is crossed by six tracks of diffused donor doped polysilicon each situated on a portion of the thin oxide layer 23. From the section it is seen that at each of the six crossings there is a discontinuity in the $n^+$-region 24, 25. At three of the crossings the discontinuity is in the form of an absence of any donor impurity and due to the diffusion masking provided by the polysilicon tracks. At these crossings enhancement transistors are formed and the polysilicon tracks in which the gate electrodes are formed are indicated as $A_0Q$, $A_1Q$ and $A_2Q$. At the other three crossings the discontinuity is in the form of a change in the donor level and at these areas the surface contains concentrations 26 of implanted donor ions in order to render the transistor structures formed with the overlying polysilicon tracks as depletion transistors. As is apparent from FIG. 6 this implanted donor concentration will also be present in the immediately adjoining parts of the strip-shaped region 24, 25 but in view of its relatively small concentration compared with that in the $n^+$-diffused surface region it is not shown in said parts in FIG. 7.

At the surface of the p-type body 21 below the thicker oxide layer 22 there is a more highly doped surface region 31 which constitutes a channel stopper as conventionally used in silicon gate circuits. Extending over the polysilicon tracks and the parts of the silicon surface previously exposed during the donor diffusion to form the region 24, 25 and dope the polysilicon there is a deposited layer of silicon oxide 32. In an opening 27 (FIG. 6) formed in the layer 32 there is formed a conductive connection between the n$^{30}$-region part 25 and an aluminum track 28 which further extends on the layer 32. Further aluminum tracks 34 and 35 extending on the deposited silicon oxide layer 32 are shown in FIG. 7. On the upper surface of the layer 32 and covering the aluminum tracks 28, 34 and 35 there is a deposited glass layer 36.

Many modifications are possible within the scope of the invention. The integrated circuit may be formed using a self-aligned technology other than that described which uses polysilicon for the gate electrodes, for example using a metal gate self-aligned technology. Although the embodiments described are both dynamic logic systems it is alternatively possible to apply the structure in accordance with the invention in static ratioed logic in which the array transistors are of equivalent size, the transistor $T_{10}$ (see FIG. 1) not being present and the transistor $T_1$ consisting of a very high impedance depletion transistor. Equivalent advantages arise when forming such circuits, particularly when aluminum is used as a second level interconnect the lay-out being considerably simplified.

In the embodiments described the array transistors are formed as enhancement transistors and depletion transistors, a depletion transistor being one which is ON at the low logic level. When shifting the logic levels it is of course possible to use all enhancement transistors in the array of which one group has a different threshold voltage from a second group. Thus in such a modification when using positive logic in an n-channel configuration the logic levels will be arranged such that the transistors of the group with the lower threshold voltage will be conducting in both logic states.

It is further mentioned that an integrated circuit in accordance with the invention may comprise a plurality of irregular arrays having the said structure and located at various positions at the surface of the semiconductor body. The further feature of being able to use a second level of interconnect, such as aluminum layer parts, within the array in such a manner that the logic can be arranged in terms of lay-out to maximum advantage also means that in a large scale intergrated circuit comprising a plurality of logic circuits each formed as an array of the said form, the arrays can be readily distributed with respect to the interconnection pattern of various circuit parts formed by parts of the aluminum layer.

What is claimed is:

1. An integrated circuit for the generation of at least one logic combination of applied logic input signals in a two-state logic system and comprising a semiconductor body having a part mainly of a first conductivity type, an array of insulated gate field effect transistors formed in said part and having gate electrodes self-registered with source and drain electrode regions, and a plurality of substantially parallel first conductive tracks which comprise the transistor gate electrodes and a plurality of substantially parallel strip-shaped surface regions of a second conductivity type opposite to that of the first which adjoin a surface of the body and cross the first conductive tracks, said transistors being formed at the crossings, said surface regions comprising the source and drain electrode regions of said transistors, a first group of the transistors being transistors of a first form having a first threshold voltage and a second group of the transistors being transistors of a second form having a second threshold voltage different from the first, said logic input signals in operation being applied to the gate electrodes of the transistors of one of said first and second groups of transistors, said logic combination to be generated being predetermined by the crossings and the form of transistor present at each such crossing and by the interconnections of transistors of said one of said first and second groups via the second conductivity type strip-shaped surface regions, the array being a nonuniform array in which at least one of the plurality first conductive tracks and the plurality of strip-shaped surfaces regions are not all of the same length, said logic combination further being predetermined by further interconnections formed within the array, and said further interconnections comprising at least a branching of a selected strip-shaped region.

2. An integrated circuit as claimed in claim 1, in which said plurality of first conductive tracks extends as a group of lines at least partly on insulating material on said body surface and substantially parallel in a first direction and said plurality of substantially parallel strip-shaped surface regions of the second conductivity type extends as a group of lines substantially parallel in a second direction which is substantially at right angles to the first direction, said strip-shaped surface regions of the second conductivity type having discontinuities at the areas of the crossings, said first and second threshold voltages being such that the transistors of the second group are conducting in both logic states and the transistors of the first group are conducting only in one logic state, said logic input signals in operation being applied to the gate electrodes of the transistors of the first group, said logic combination to be generated being determined by the interconnection pattern of the first group of transistors, said interconnection pattern comprising the series connection of the main current path of each first group transistor in a common line extending in said second direction and provided by the strip-shaped surface region associated with said line and the main current path of each second group transistor in said line, and said interconnection pattern further comprising the connection of the main current paths of at least one first group transistor in different lines extending in said second direction, the lines in at least one of said two groups of lines being of a plurality of different lengths and said further interconnections comprising further second conductivity type strip-shaped surface regions extending in a direction substantially parallel to the first direction.

3. An integrated circuit as claimed in claim 2, wherein the interconnection pattern further comprises second conductive tracks provided within the array which extend on an insulating material and are separated from the first conductive tracks by said insulating material where overlying said first conductive tracks, the second conductive tracks forming conductive connections via apertures in the insulating material to at least one of the first conductive tracks and the opposite conductivity type surface regions.

4. An integrated circuit as claimed in claim 3, wherein the second conductive tracks are of aluminum.

5. An integrated circuit as claimed in claim 2, wherein the lines of first conductive tracks extending in said first direction are of a plurality of different lengths and the lines of strip-shaped regions extending in said second direction are of a plurality of different lengths.

6. An integrated circuit as claimed in claim 2, wherein a single first conductive track is present in more than one of said lines extending in said first direction.

7. An integrated circuit as claimed in claim 2, wherein the first conductive tracks in the first direction and the strip-shaped opposite conductivity type surface regions in the second direction are provided along the lines of a grid with the transistor structures at the crossings being present at grid points.

8. An integrated circuit as claimed in claim 2, wherein the further opposite conductivity type surface regions within the array are arranged substantially along parts of grid lines where there are no first conductive tracks.

9. An integrated circuit as claimed in claim 1, wherein the transistors of said first group are enhancement transistors and the transistors of said second group are depletion transistors.

10. An integrated circuit as claimed in claim 1, wherein the first conductive tracks are of polycrystalline silicon.

11. An integrated circuit as claimed in in claim 1, wherein the integrated circuit comprises a logic system having clock controlled flip-flops with combinatorial logic circuit parts connected to the flip-flops, the combinatorial logic circuit parts being realized within the array of transistors, the interconnections between the flip-flops and the interconnections of the transistors to form the combinatorial logic circuit parts being commonly associated and defined within the array.

* * * * *